(12) United States Patent
Saenger

(10) Patent No.: US 9,195,057 B2
(45) Date of Patent: Nov. 24, 2015

(54) ILLUMINATION OPTICAL UNIT FOR A PROJECTION EXPOSURE APPARATUS

(71) Applicant: Carl Zeiss SMT GmbH, Oberkochen (DE)

(72) Inventor: Ingo Saenger, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/465,002

(22) Filed: Aug. 21, 2014

(65) Prior Publication Data

US 2014/0362360 A1 Dec. 11, 2014

Related U.S. Application Data

(63) Continuation of application No. PCT/EP2013/054404, filed on Mar. 5, 2013.

(60) Provisional application No. 61/610,532, filed on Mar. 14, 2012.

(30) Foreign Application Priority Data

Mar. 14, 2012 (DE) .......................... 10 2012 203 950

(51) Int. Cl.
*G03B 27/54* (2006.01)
*G03B 27/72* (2006.01)
(Continued)

(52) U.S. Cl.
CPC .......... *G02B 26/0858* (2013.01); *G02B 5/3066* (2013.01); *G02B 19/0023* (2013.01);
(Continued)

(58) Field of Classification Search
CPC ............ G03F 7/70075; G03F 7/70191; G03F 7/70058
USPC ................................ 355/53, 67, 71; 359/849
See application file for complete search history.

(56) References Cited

U.S. PATENT DOCUMENTS

| 6,859,515 | B2 | 2/2005 | Schultz et al. |
| 2005/0083503 | A1 | 4/2005 | Antoni et al. |
| 2006/0132747 | A1 | 6/2006 | Singer et al. |
| 2006/0138364 | A1 | 6/2006 | Miyake |

(Continued)

FOREIGN PATENT DOCUMENTS

| DE | 10 2008 002 749 | 12/2009 |
| EP | 1 225 481 A | 7/2002 |
| WO | WO 2012/025365 | 3/2012 |

OTHER PUBLICATIONS

International Search Report for corresponding PCT Appl No. PCT/EP2013/054404, dated Jul. 5, 2013.
German Office Action, with translation thereof, for corresponding DE Appl No. 10 2012 203 950.3, dated Nov. 11, 2012.

*Primary Examiner* — Hung Henry Nguyen
(74) *Attorney, Agent, or Firm* — Fish & Richardson P.C.

(57) ABSTRACT

An illumination optical unit for a projection exposure apparatus serves for guiding illumination light toward an illumination field, in which a lithography mask can be arranged. A first facet mirror has a plurality of individual mirrors that provide illumination channels for guiding illumination light partial beams toward the illumination field. The individual mirrors each bear a multilayer reflective coating. A second facet mirror is disposed downstream of the first facet mirror in the beam path of the illumination light. A respective facet of the second facet mirror with at least one of the individual mirrors of the first facet mirror completes the illumination channel for guiding the illumination light partial beam toward the illumination field.

20 Claims, 6 Drawing Sheets

(51) Int. Cl.
*G02B 26/08* (2006.01)
*G03F 7/20* (2006.01)
*G02B 5/30* (2006.01)
*G02B 19/00* (2006.01)

(52) U.S. Cl.
CPC ........ *G02B19/0095* (2013.01); *G03F 7/70058* (2013.01); *G03F 7/70075* (2013.01); *G03F 7/70116* (2013.01); *G03F 7/70191* (2013.01); *G03F 7/70566* (2013.01)

(56) References Cited

U.S. PATENT DOCUMENTS

| | | |
|---|---|---|
| 2008/0013680 A1 | 1/2008 | Singer et al. |
| 2008/0192225 A1 | 8/2008 | Mann et al. |
| 2010/0231877 A1* | 9/2010 | Wolschrijn et al. ............. 355/66 |
| 2011/0001947 A1 | 1/2011 | Dinger et al. |
| 2011/0012010 A1* | 1/2011 | Major ........................ 250/201.1 |
| 2011/0122392 A1 | 5/2011 | Fiolka et al. |
| 2012/0044474 A1 | 2/2012 | Hauf et al. |

\* cited by examiner

ILLUMINATION OPTICAL UNIT FOR A PROJECTION EXPOSURE APPARATUS

CROSS-REFERENCE TO RELATED APPLICATIONS

The present application is a continuation of, and claims benefit under 35 USC 120 to, international application PCT/EP2013/054404, filed Mar. 5, 2013, which claims benefit under 35 USC 119 of German Application No. 10 2012 203 950.3, filed Mar. 14, 2012. International application PCT/EP2013/054404 also claims priority under 35 USC 119(e) to U.S. Provisional Application No. 61/610,532, filed Mar. 14, 2012. The entire disclosure of international application PCT/EP2013/054404 and German Application No. 10 2012 203 950.3 are incorporated by reference herein.

The invention relates to an illumination optical unit for a projection exposure apparatus, in particular for an EUV projection exposure apparatus, for guiding illumination light toward an illumination field, in which a lithography mask can be arranged. Furthermore, the invention relates to an illumination system comprising such an illumination optical unit, a projection exposure apparatus comprising such an illumination system, a method for producing a micro- or nanostructured component, in particular a semiconductor chip, with the aid of such a projection exposure apparatus, and a micro- or nanostructured component produced by the method.

An illumination optical unit for an EUV projection exposure apparatus is known, inter alia, from US 2011/0001947 A1.

It is an object of the present invention to develop an illumination optical unit of the type mentioned in the introduction in such a way that the illumination is adaptable for obtaining an optimum resolution capability during the projection exposure.

This object is achieved according to the invention via an illumination optical unit for a projection exposure apparatus for guiding illumination light toward an illumination field, in which a lithography mask can be arranged. The unit comprises a first facet mirror having a plurality of individual mirrors that provide illumination channels for guiding illumination light partial beams toward the illumination field, wherein the individual mirrors each bear a multilayer reflective coating. The unit also comprises a second facet mirror, which is disposed downstream of the first facet mirror in the beam path of the illumination light, wherein a respective facet of the second facet mirror with at least one of the individual mirrors of the first facet mirror completes the illumination channel for guiding the illumination light partial beam toward the illumination field. The individual mirrors are arranged such that the respective illumination light partial beam is incident on the individual mirror with an angle of incidence, whereby a plane of incidence is defined. The angle of incidence is predefined such that a ratio Rp/Rs is less than 0.8, wherein Rp is the reflectivity for illumination light polarized in the plane of incidence, and Rs is the reflectivity for illumination light polarized perpendicularly to the plane of incidence.

According to the invention, it has been recognized that in particular on account of the multilayer reflective coating of the individual mirrors, a polarization selection of the illumination light can be effected via a reflection geometry at the individual mirrors. The polarization selection takes place by virtue of the fact that illumination light polarized perpendicularly to the plane of incidence of the reflection at the respective individual mirror is reflected with preference relative to illumination light polarized parallel to the plane of incidence. From illumination light incident on the facet mirror arrangement substantially in an unpolarized manner, illumination light having illumination light partial beams polarized in a preferred direction can be generated in this way. It is thereby possible to provide an illumination of the illumination field in which, in particular depending on the illumination angle, that polarization which is required for fulfilling demanding resolution stipulations is used in each case in a targeted manner. The ratio Rp/Rs can be less than 0.7, can be less than 0.6, can be less than 0.5, can be less than 0.4, can be less than 0.3, can be less than 0.2, can be less than 0.1, can be less than 0.05, can be less than 0.02, can be less than 0.01, can be less than $1 \times 10^{-3}$, can be less than $1 \times 10^{-4}$ and can be less than $1 \times 10^{-5}$. In particular, the ratio Rp/Rs can be exactly 0; therefore, that component of the respective illumination light partial beam which is polarized in the plane of incidence can be completely suppressed via the reflection at the respective individual mirror. In general, a facet of the second facet mirror together with a group of individual mirrors of the first facet mirror completes a group illumination channel to which the facet of the second facet mirror and a group of individual mirrors of the first facet mirror belong. Such an arrangement is known, in principle, from US 2011/0001947 A1. The ratio Rp/Rs can be predefined via the angle of incidence of the respective illumination light partial beam on the individual mirror and, depending on the construction of the multilayer reflective coating, is sensitively dependent on the angle of incidence.

Angles of incidence at which the respective illumination light partial beam is incident on the individual mirror deviates by a maximum of 25° from a Brewster angle IB of the multilayer reflective coating are particularly suitable for predefining a ratio Rp/Rs that gives preference to the polarization component oscillating perpendicularly to the plane of incidence. A deviation of the angle of incidence from the Brewster angle can be less than 20°, can be less than 10°, can be less than 5°, can be less than 3°, can be less than 2° or can be less than 1°. In particular, the angle of incidence can correspond exactly to the Brewster angle.

The individual mirrors can be arranged on an individual-mirror carrier embodied rotationally symmetrically with respect to an axis of incidence of the illumination light incident on the first facet mirror, and/or the facets of the second facet mirror are arranged on a facet carrier embodied rotationally symmetrically with respect to an axis (k) of incidence of the illumination light incident on the first facet mirror. Such carriers arranged rotationally symmetrically make possible reflection geometries for the illumination light partial beams at the facet mirrors for which angles of incidence are used which deviate only slightly from an average angle of incidence, the average angle of incidence then being that which is used for predefining the desired ratio Rp/Rs.

A ring-shaped facet carrier makes possible, in particular, a tangential polarization in the illumination of the illumination field, in the case of which an object in the illumination field can be illuminated in a manner polarized perpendicularly to the plane of incidence of the illumination light on the object, independently of the illumination angle.

The illumination optical unit can be embodied such that a section of the illumination field that is less than 80% of the total illumination field is illuminated via an illumination channel via which the illumination light is guided via a facet of the second facet mirror. Such section-by-section of the illumination field makes possible an arrangement of the illumination optical unit in the manner of the specular reflector, as is known, apart from the polarization predefinition, for example from US 2006/0132747 A1. The illuminated section of the illumination field can be less than 50% of the total illumination field or can be even smaller, e.g. ⅓, ¼, ⅙, or can comprise an even smaller fraction of the total illumination field.

The advantages of an illumination system including such an illumination optical system, of a projection exposure apparatus including such an illumination system, of a production method using such a projection exposure apparatus, and of a component made by such a method correspond to those which have already been explained above with reference to the illumination optical unit according to the invention. The component can be produced with extremely high structural resolution. By way of example, a semiconductor chip with an extremely high integration density or storage density can be produced in this way.

Exemplary embodiments of the invention are explained in greater detail below with reference to the drawing. In which:

FIG. 1 schematically shows a meridional section through a projection exposure apparatus for EUV projection lithography, the illustration showing illumination light guidance in an illumination optical unit schematically and not according to the invention;

FIG. 2 likewise shows in a meridional section an excerpt from an embodiment according to the invention of the illumination optical unit in the region of beam guiding of illumination light via two facet mirrors of the illumination optical unit toward an illumination field;

Figure 1:
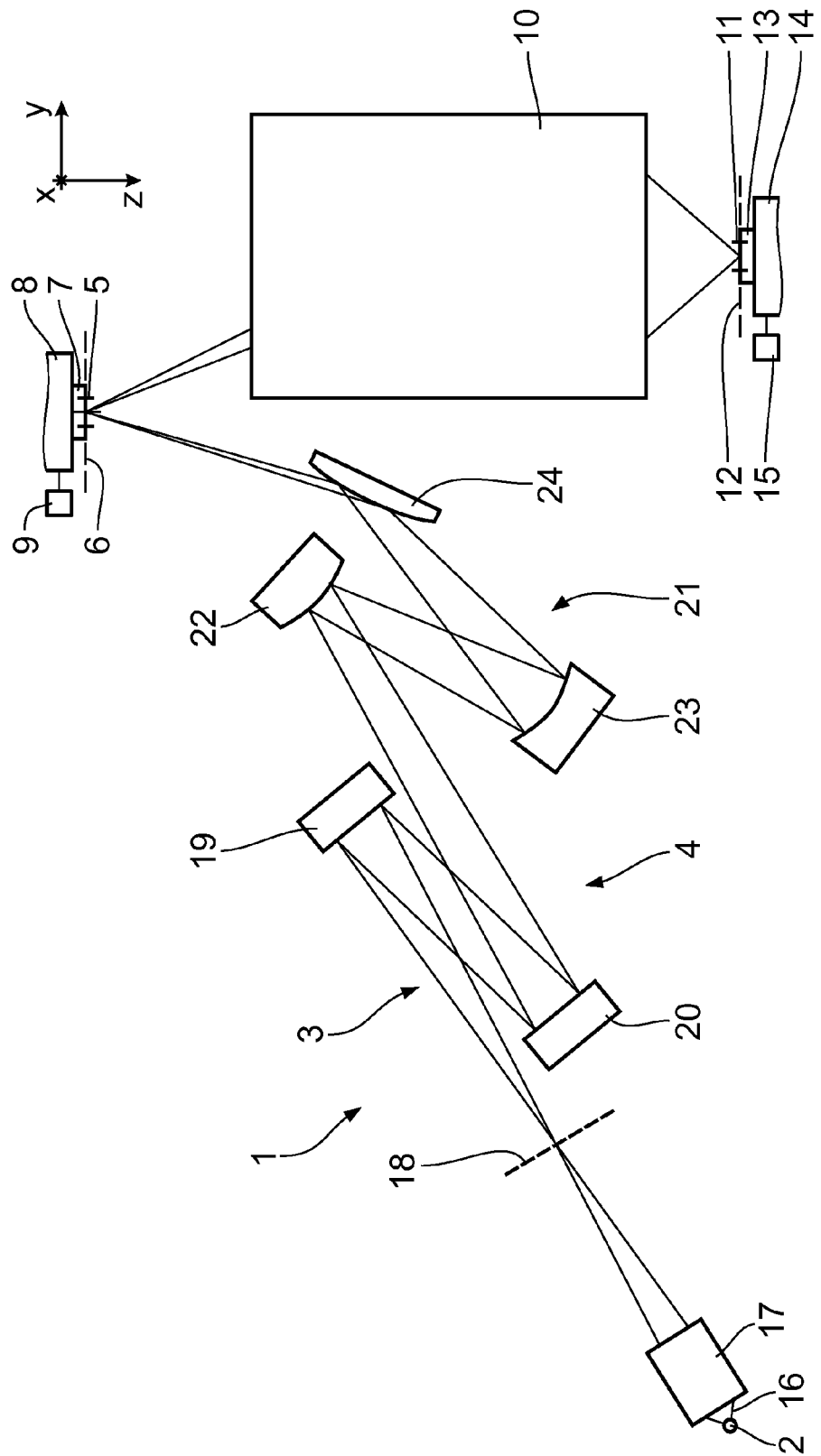

FIG. 1 schematically shows a projection exposure apparatus 1 for microlithography in a meridional section. The projection exposure apparatus 1 includes a light or radiation source 2. An illumination system 3 of the projection exposure apparatus 1 has an illumination optical unit 4 for exposing an illumination field coinciding with an object field 5 in an object plane 6. The illumination field can also be larger than the object field 5. An object in the form of a reticle 7, which is arranged in the object field 5 and which is held by an object or reticle holder 8, is exposed in this case. The reticle 7 is also designated as a lithography mask. The object holder 8 is displaceable along a displacement direction via an object displacement drive 9. A projection optical unit 10 serves for imaging the object field 5 into an image field 11 in an image plane 12. A structure on the reticle 7 is imaged onto a light-sensitive layer of a wafer 13 arranged in the region of the image field 11 in the image plane 12. The wafer 13 is held by a wafer holder 14. The wafer holder 14 is likewise displaceable along the displacement direction in a manner synchronized with the object holder 8 via a wafer displacement drive 15.

The radiation source 2 is an EUV radiation source having an emitted used radiation in the range of between 5 nm and 30 nm. This can involve a plasma source, for example a GDPP source (Gas Discharge-Produced Plasma) or an LPP source (Laser-Produced Plasma). A radiation source based on a Synchrotron or on a Free Electron Laser (FEL) can also be used for the radiation source 2. Information concerning such a radiation source can be found by the person skilled in the art for example from U.S. Pat. No. 6,859,515 B2. EUV radiation 16 emerging from the radiation source 2 is concentrated by a collector 17. A corresponding collector is known from EP 1 225 481 A. Downstream of the collector 17, the EUV radiation 16 propagates through an intermediate focal plane 18 before it impinges on a field facet mirror 19. The field facet mirror 19 is a first facet mirror of the illumination optical unit 4. The first facet mirror 19 has a multiplicity of individual mirrors (not illustrated in FIG. 1). The first facet mirror 19 is arranged in a plane of the illumination optical unit 4 which is optically conjugate with respect to the object plane 6.

The EUV radiation 16 is hereinafter also designated as illumination light or as imaging light. The illumination light 16 is incident on the first facet mirror 19 in an unpolarized manner, that is to say with a uniformly distributed polarization. Upstream of the first facet mirror 19, therefore, polarization vectors of the illumination light 16 oscillate perpendicularly to the axis k of incidence in a manner distributed uniformly in all directions parallel to the xy plane.

Downstream of the first facet mirror 19, the EUV radiation 16 is reflected by a pupil facet mirror 20. The pupil facet mirror 20 is a second facet mirror of the illumination optical unit 4. The pupil facet mirror 20 is arranged in a pupil plane of the illumination optical unit 4 which is optically conjugate with respect to the intermediate focal plane 18 and with respect to a pupil plane of the projection optical unit 10 or coincides with the pupil plane. The pupil facet mirror 20 has a plurality of pupil facets (not illustrated in FIG. 1). With the aid of the pupil facets of the pupil facet mirror 20 and a downstream imaging optical assembly in the form of a transfer optical unit 21 having mirrors 22, 23 and 24 designated in the order of the beam path, individual mirror groups of the field facet mirror 19 are imaged into the object field 5. The last mirror 24 of the transfer optical unit 21 is a mirror for grazing incidence ("grazing incidence mirror").

In order to facilitate the description of positional relationships, FIG. 1 depicts a Cartesian xyz coordinate system as a global coordinate system for describing the positional relationships of components of the projection exposure apparatus 1 between the object plane 6 and the image plane 12. In FIG. 1, the x-axis runs perpendicularly to the plane of the drawing into the latter. In FIG. 1, the y-axis runs toward the right and parallel to the displacement direction of the object holder 9 and of the wafer holder 14. In FIG. 1, the z-axis runs downward, that is to say perpendicularly to the object plane 6 and to the image plane 12.

The x-dimension over the object field 5 or the image field 11 is also designated as field height.

In the case of the projection exposure apparatus 1 according to FIG. 1, the field facet mirror 19 is the first facet mirror and the pupil facet mirror 20 is the second facet mirror in the beam path of the illumination light 16. The facet mirrors 19, 20 can also interchange their function. Thus, the first facet mirror 19 can be a pupil facet mirror, which is then arranged in a pupil plane of the projection optical unit 10 or in a conjugate plane with respect thereto, and the second facet mirror 20 can be a field facet mirror, which is then arranged in a field plane which is optically conjugate with respect to the object plane 6.

In the case of the illumination optical unit 25, the first facet mirror 19 has a plurality of individual mirrors 26 that provide illumination channels for guiding illumination light partial beams 16, toward the object field or illumination field 5. The individual mirrors 26 are arranged on an individual-mirror carrier 27. The individual-mirror carrier 27 is embodied rotationally symmetrically with respect to an axis k of incidence of the illumination light 16, the axis running parallel to the z-axis. The individual-mirror carrier 27 is embodied with a round carrier surface 28 arranged parallel to the xy plane. The individual-mirror carrier 27 lies between the incident illumination light 16 and the object field 5.

The individual mirrors 26 can have square or rectangular reflective surfaces arranged in a densely packed manner on the individual-mirror carrier 27. Other forms of individual mirrors which enable the reflective surface of the first facet mirror 19 to be occupied as far as possible without any gaps can also be used. Such alternative individual-mirror forms are known from the mathematical theory of parqueting. In this connection, reference should be made to the references indicated in US 2011/0001947 A1.

Depending on the embodiment of the first facet mirror 19, the individual mirrors 26 have x/y extents in the range of, for example, from 100 µm×100 µm to, for example, 5 mm×5 mm. The individual mirrors 26 can be shaped such that they have a concentrating effect for the illumination light 16.

The individual mirrors 26 can have an arrangement on the individual-mirror carrier 27 which is rotationally symmetrical with respect to the axis k of incidence of the illumination light 16. The arrangement can be embodied, for example, in a plurality of concentric rings of individual mirrors 26 on the individual-mirror carrier 27, wherein the center of this individual-mirror arrangement coincides with an intersection point of the axis k of incidence of the illumination light 16 through the carrier surface 28.

Figure 2:
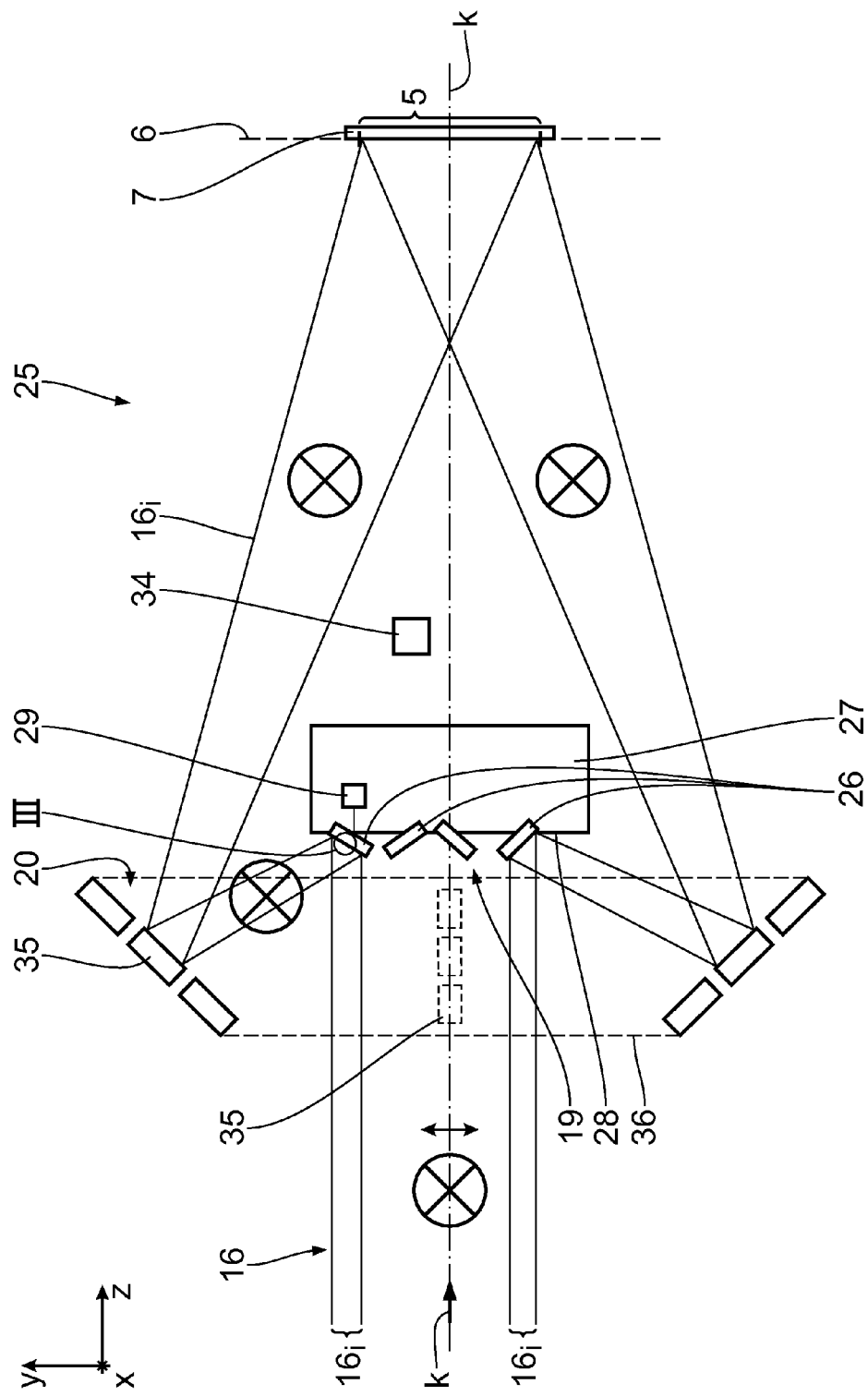

The meridional section according to FIG. 2 illustrates by way of example four of the individual mirrors 26. In a real embodiment of a first facet mirror 19, the number of individual mirrors 26 is very much higher. Overall, the first facet mirror 19 has several hundred to several thousand of the individual mirrors 26.

A total reflective surface of the first facet mirror 19, composed of the reflective surfaces of the individual mirrors 26, has an extent of, for example, 300 mm×300 mm or 600 mm×600 mm, depending on the embodiment of the first facet mirror 19.

Each of the individual mirrors 26, for individually deflecting impinging illumination light 16, is respectively connected to an actuator 29, as indicated on the basis of the topmost individual mirror 26 illustrated in FIG. 2. The actuators 29 are arranged on that side of each of the individual mirrors 26 which faces away from a reflective side of the individual mirrors 26. The actuators 29 can be embodied, for example, as piezoactuators. Configurations of such actuators are known from the construction of micromirror arrays.

Each of the individual mirrors 26 can be individually tilted independently about two mutually perpendicularly tilting axes, wherein a first of the tilting axes runs parallel to the x-axis and the second of the two tilting axes runs parallel to the y-axis. The two tilting axes lie in the individual reflective surfaces of the respective individual mirrors 26.

Figure 3:
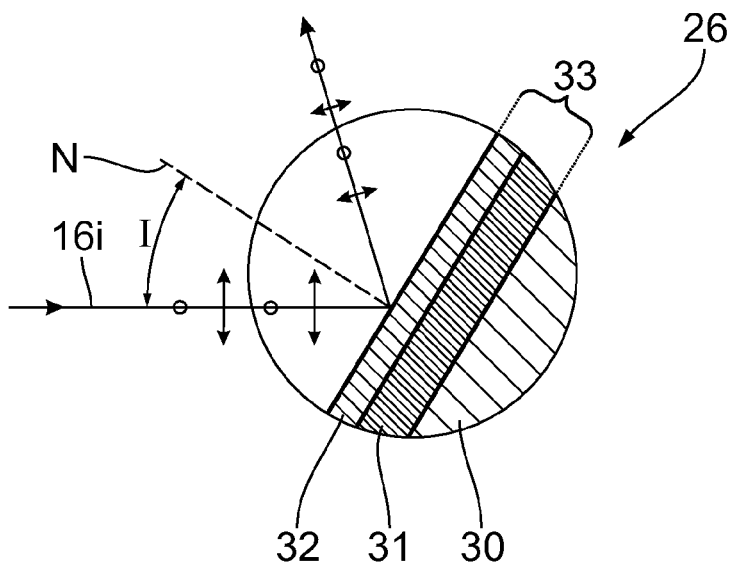
FIG. 3 shows an excerpt enlargement in the region of the detail III in FIG. 2.

The reflective surfaces of the individual mirrors 26 bear multilayer reflective coatings. FIG. 3 shows an excerpt enlargement in the region of a reflective surface of one of the individual mirrors 26. Reflective layers 31, 32 are applied on an individual-mirror main body 30, which layers can be alternate layers composed of molybdenum (Mo) and silicon (Si). FIG. 3 illustrates by way of example a bilayer 31, 32 comprising in each case one Mo layer and Si layer. A total reflective coating 33 can have a plurality of such bilayers 31, 32, for example 5, 10, 20, 30 or even more bilayers of this type.

The individual mirrors 26 of the first facet mirror 19 are arranged such that the respective illumination light partial beam $16_i$ is incident on the individual mirror 26 with an angle I of incidence with respect to a normal N to the individual-mirror reflective surface which, upon the reflection of the illumination light partial beam 16, at the individual mirror 26, gives preference to an s-polarization in comparison with a p-polarization. The s-polarization concerns the direction of polarization of the illumination light partial beam 16, which oscillates perpendicularly to the plane of incidence (plane of the drawing in FIG. 3) of the individual mirror 26. The p-polarization concerns that polarization of the illumination light partial beam 16, which oscillates in the plane of incidence of the individual mirror 26. The s-polarization is indicated by crossed-through circles in FIG. 2. The p-polarization is indicated by a double-headed arrow arranged perpendicularly to the axis k of incidence in FIG. 2. The s-polarization is represented by large dots on the beam path of the illumination light partial beam $16_i$ in FIG. 3. The p-polarization is represented by double-headed arrows on the beam path of the illumination light partial beam $16_i$. The preference given to s-polarization relative to p-polarization upon the reflection of the illumination light partial beam $16_i$ at the individual mirror 26 is such that a ratio Rp/Rs between a reflectivity Rp for the p-polarized illumination light 16 and a reflectivity Rs for the s-polarized illumination light 16 is less than 0.8. This preference given to s-polarization is illustrated in FIG. 3 by the fact that after the reflection of the illumination light partial beam $16_i$ at the individual mirror 26, the p-polarization component is represented by a shorter double-headed arrow in comparison with the incident illumination light partial beam $16_i$ the intensity of the s-polarization component being influenced less by the reflection at the individual mirror 26, which is illustrated by dots on the reflected beam path of the reflected illumination light partial beam $16_i$ which are the same size as the dots on the incident beam.

Figure 4:
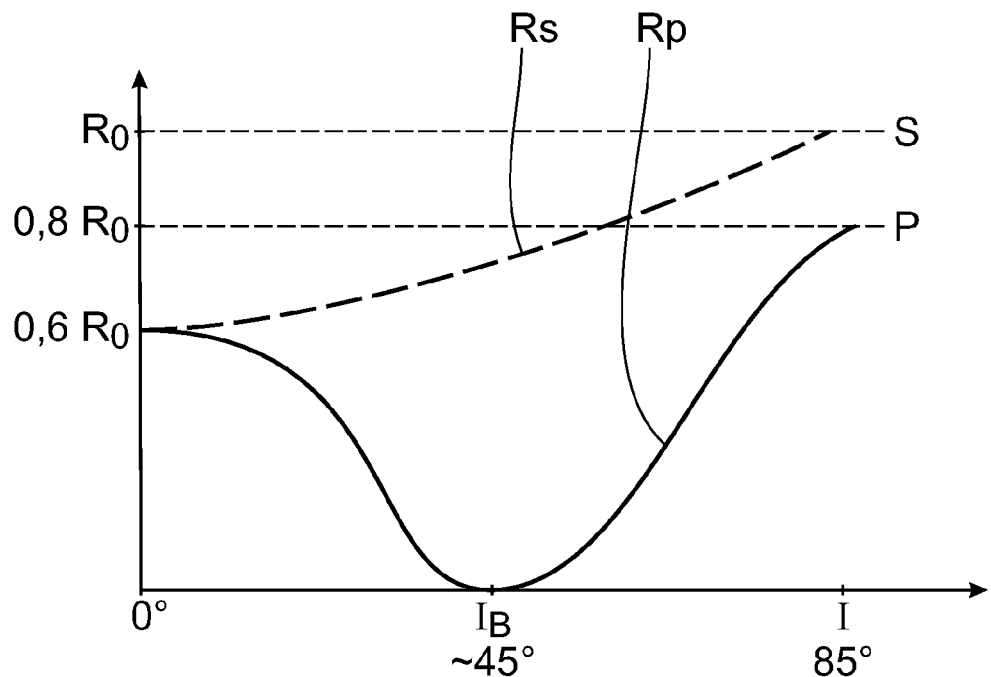
FIG. 4 shows in a diagram a dependence of a reflection R of the illumination light on an angle I of incidence on an individual mirror of a first facet mirror of the illumination optical unit according to FIG. 2, plotted firstly for illumination light (S) polarized perpendicularly to the plane of incidence and for illumination light (P) polarized parallel to the plane of incidence.

The dependence of the reflectivities Rs, Rp on the angle I of incidence is illustrated in FIG. 4.

Rs rises in the case of an angle of incidence of I=0° (normal incidence) from a value of $0.6R_0$ monotonically up to a maximum value $R_0$ in the case of an in practice maximum angle of incidence of 85°.

The reflectivity Rp falls proceeding from the value $0.6 R_0$ in the case of the angle of incidence of I=0° firstly monotonically down to a reflectivity Rp=0 in the case of a Brewster angle $I_B$ of incidence, which is in the region of an angle of incidence of 45°. For angles of incidence of $I>I_B$, the reflectivity Rp rises monotonically again up to a value of approximately $0.8 R_0$ in the case of the in practice maximum angle of incidence of approximately 85°. The ratio Rp/Rs is less than 0.8 in a range of angles I of incidence starting from a value of approximately I≥20°. For angles I of incidence in the region of the Brewster angle $I_B$, the ratio becomes continuously smaller, depending on how close the actual angle I of incidence is to the Brewster angle $I_B$. At the Brewster angle $I_B$ itself, the ratio Rp/Rs is 0.

Depending on the arrangement of the individual mirror 26, the angle I of incidence on the individual mirror 26 can be predefined so as to result in a ratio Rp/Rs which is less than 0.7, which is less than 0.6, which is less than 0.5, which is less than 0.4, which is less than 0.3, which is less than 0.2, which is less than 0.1, which is less than 0.05, which is less than 0.02, which is less than 0.01, which is less than $1\times10^{-3}$, which is less than $1\times10^{-4}$, which is less than $1\times10^{-5}$ or which is even smaller still.

For the angle I of incidence at which the respective illumination light partial beam 16, is incident on the respective individual mirror 26, depending on the orientation of the individual mirror 26, it is possible to achieve a predefined value $I-I_B$, that is to say a deviation with respect to the Brewster angle $I_B$, whose absolute value is less than 25°, less than 20°, less than 10°, less than 5°, less than 3°, less than 2°, less than 1° and in particular is exactly at the Brewster angle $I_B$.

These predefined values for the angles I of incidence can be monitored on a central control device 34 of the illumination optical unit 25, which is signal-connected to the actuators 29 of the individual mirrors 26 in a manner not illustrated. Via a look-up table, the predefined values can also be linked to desired values for the reflectivity ratio Rp/Rs to be achieved.

The second facet mirror 20 is disposed downstream of the first facet mirror 19 in the beam path of the illumination light 16 (cf. FIG. 2). A respective facet 35 of the second facet mirror 20 with at least one of the individual mirrors 26 of the first facet mirror 19 completes the illumination channel for guiding the illumination light partial beams 16, toward the illumination field 5. In general, the arrangement is such that one of the facets 35 of the second facet mirror 20 together with a group of individual mirrors 26 of the first facet mirror 19 completes a group illumination channel for a plurality of partial beams 16, to which the facet 35 of the second facet mirror 20 and a group of individual mirrors 26 of the first facet mirror 19 belong. This group of individual mirrors 26 of the first facet mirror 19 therefore guides illumination light partial beams 16, all via exactly the same facet 35 of the second facet mirror 20 toward the illumination field 5.

Via the reflection of the illumination light partial beam 16, at the facet 35 of the second facet mirror 20, the s-polarization of the illumination light partial beam 16, is once again given preference, since here, too, a reflection takes place with an angle I of incidence that differs significantly from 0. This preference given to the s-polarization is also indicated in FIG. 2, where the s-polarization of the illumination light 16 is illustrated by a crossed-through circle and the p-polarization is illustrated by a double-headed arrow perpendicular to the axis k of incidence and lying in the plane of the drawing in FIG. 2. The double reflection of the illumination light partial beam 16, once at one of the individual mirrors 26 and a second time at one of the facets 35 of the second facet mirror 20 results in an almost complete or even entirely complete s-polarization in the case of the illumination light partial beam 16, impinging on the illumination field 5.

The facets 35 of the second facet mirror 20 are arranged on a facet carrier 36, which is indicated in a dashed manner in FIG. 2. The facet carrier 36 is embodied in a ring-shaped fashion. The facet carrier 36 is embodied rotationally symmetrically with respect to the axis k of incidence of the illumination light 16. The arrangement of the facets 35 of the second facet mirror 20 on the facet carrier 36 is correspondingly rotationally symmetrical.

The illumination optical unit 25 is arranged overall rotationally symmetrically with respect to the axis k of incidence. The axis k of incidence passes through a center of the illumination field 5. The axis k of incidence is perpendicular to the object plane 6.

The rotational symmetry of the arrangement of the individual mirrors 26 of the first facet mirror 19 and of the facets 35 of the second facet mirror 20 makes possible a beam guidance of the illumination light partial beams 16, that is rotationally symmetrical to a good approximation in any case with respect to the axis k of incidence.

Figure 6:
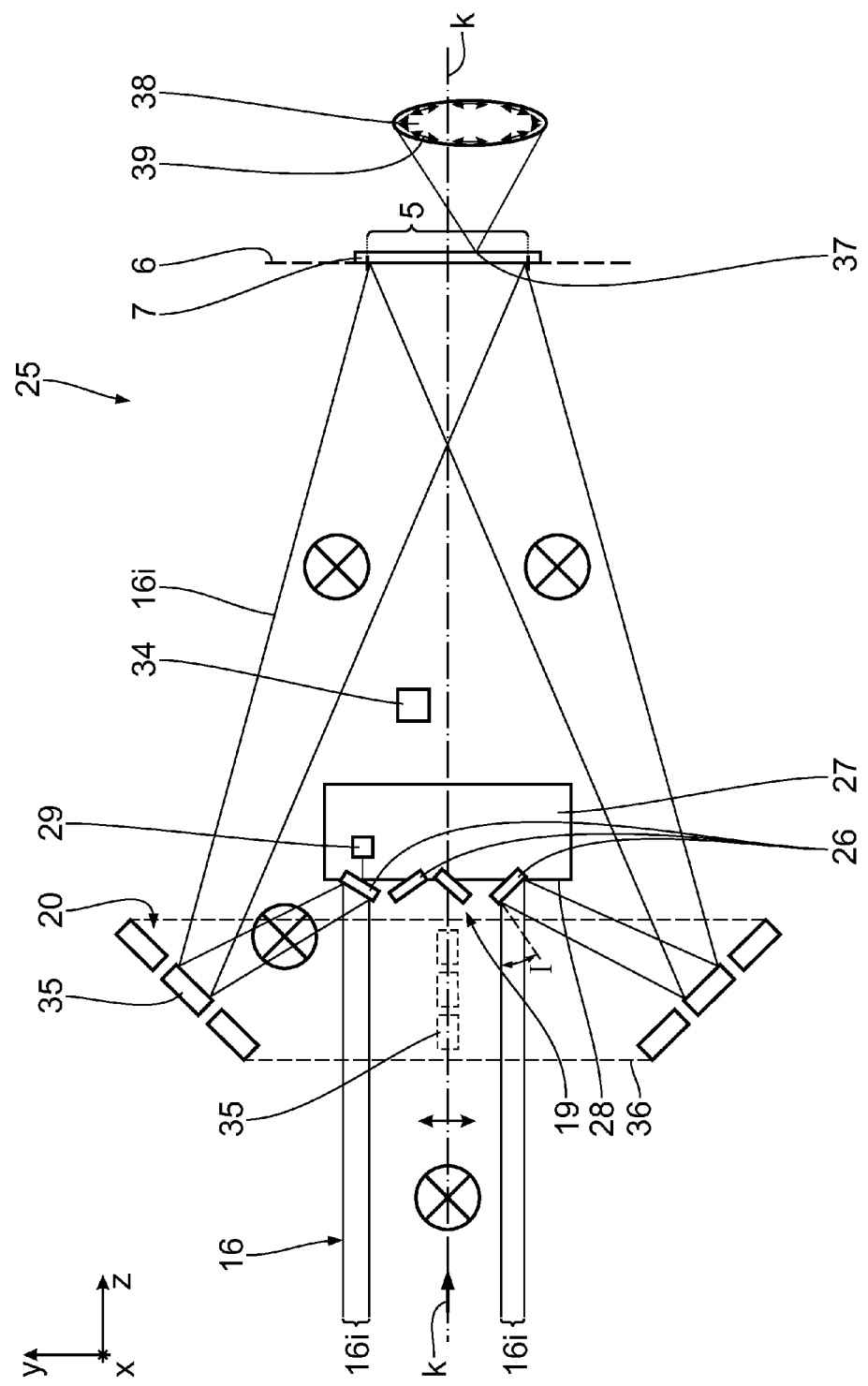
FIG. 6 shows the illumination optical unit according to FIG. 2, the illustration additionally showing a polarization distribution of an illumination of a field point of the illumination field depending on the illumination angle (tangential polarization)
Figure 7:
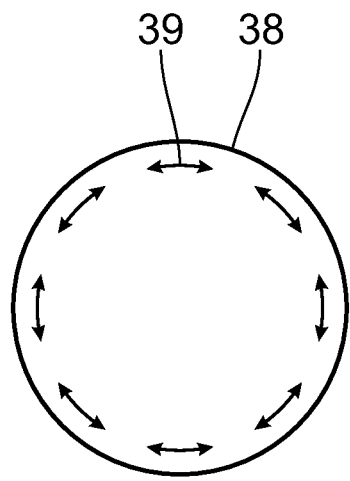
FIG. 7 shows a plan view of the polarization distribution according to FIG. 6.

Facets 35 of the second facet mirror 20 which are provided for reflecting illumination light partial beams 16, which are deflected by individual mirrors 26 of the first facet mirror 19 in the xz plane are illustrated in a dashed manner in FIG. 2 at the level of the axis k of incidence. On account of the ring-shaped design of the facet carrier 36, the field facets 35 are situated, of course, in a manner spaced apart from the axis k of incidence both in the positive and in the negative x-direction correspondingly with respect to the plane of the drawing in FIG. 2. Corresponding facets 35 are arranged in a manner distributed uniformly in the circumferential direction around the axis k of incidence on the facet carrier 36, thus resulting in the fundamentally rotationally symmetrical reflection arrangement for the illumination light partial beams 16. An illumination with tangentially polarized illumination light 16 results for each point on the illumination field 5. This is illustrated in greater detail for an illumination field point 37 in FIGS. 6 and 7.

From every illumination direction, the illumination light 16 impinges on the illumination field point 37 in an s-polarized manner. Since, on account of the ring-shaped arrangement of the field facets 35, the illumination field point 37 is illuminated with a ring-shaped illumination angle distribution 38 (the illumination field point 37 "sees" a ring-shaped light source), there arises at every location of this ring-shaped illumination angle distribution 38, indicated by a circle in FIG. 7, an s-polarization that is supplemented to form a tangential polarization. At every location of the ring-shaped illumination angle distribution 38, a polarization vector 39 oscillates tangentially with respect to the illumination angle distribution 38.

On account of this tangential polarization, the reticle 7 in the illumination field 5 can be illuminated with s-polarized illumination light 16 independently of the illumination angle. This illumination makes possible an optimized structural resolution when the illumination optical unit 25 is used as part of the projection exposure apparatus 1.

With the illumination optical unit 25, the illumination field 5 can be illuminated with illumination angles that are greater than a lower limit value for the illumination angle, which is predefined by a central shading of the beam path of the illumination light 16 that is predefined by the individual-mirror carrier 27.

With the illumination optical unit 25, it is possible to realize an annular illumination setting or else a multipole illumination setting, e.g. a dipole illumination setting or a quadrupole illumination setting, e.g. a C-Quad illumination setting.

Figure 5:
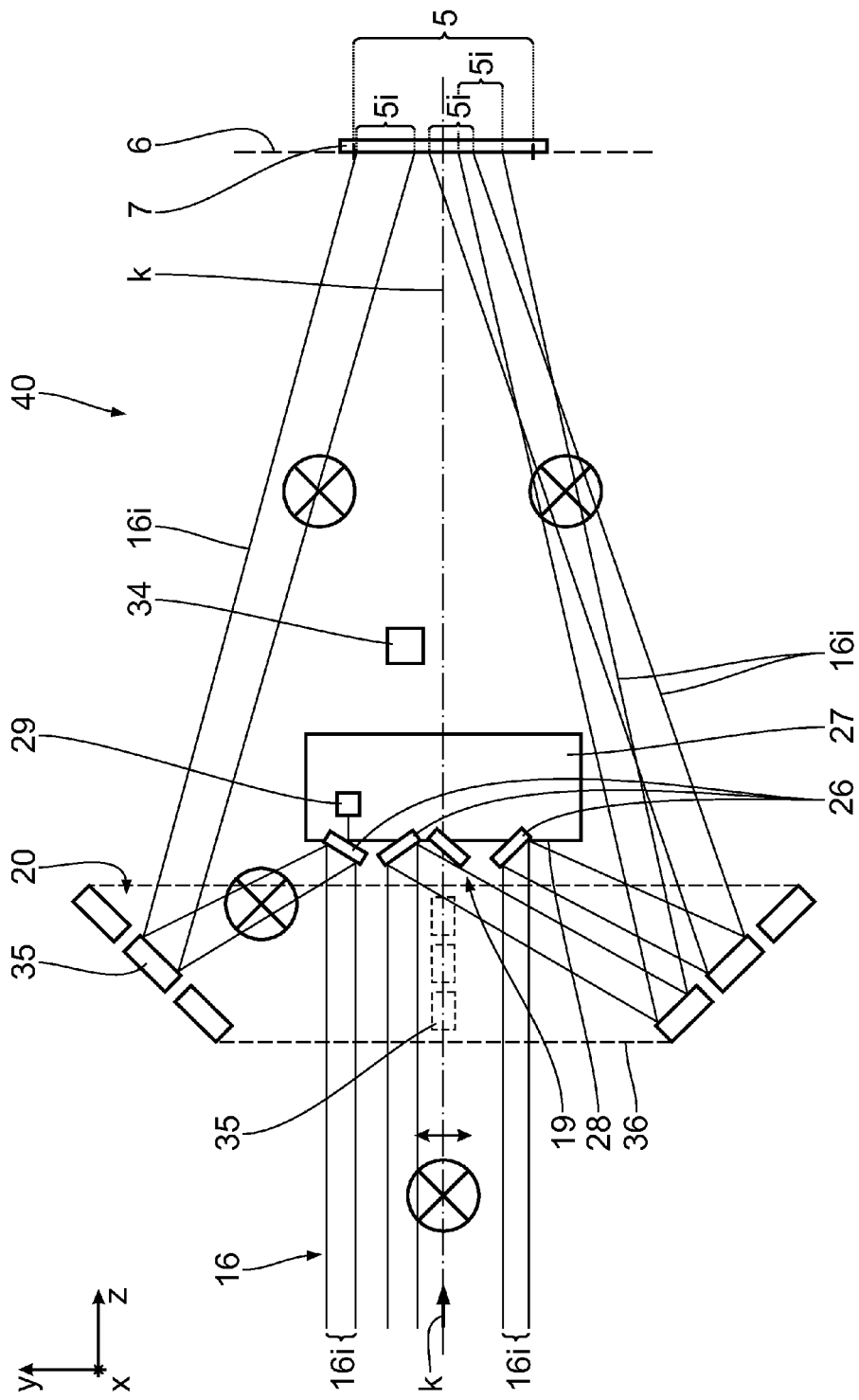
FIG. 5 shows, in an illustration similar to FIG. 2, a further embodiment of the illumination optical unit, wherein illumination light partial beams that are guided via facets of a second facet mirror of the illumination optical unit in each case illuminate a section of the illumination field, that is to say not the total illumination field.

FIG. 5 shows a further embodiment of an illumination optical unit 40, which can be used instead of the illumination optical unit 25. Components corresponding to those which have already been explained above with reference to FIGS. 1 to 4 and 6 and 7 bear the same reference numerals and will not be discussed in detail again.

In the case of the illumination optical unit 40, the illumination light 16 is guided such that a section 5, of the illumination field 5 that is less than 80% of the total illumination field 5 is illuminated via an illumination channel via which the illumination light 16 is guided via one of the facets 35 of the second facet mirror 20. The illumination field section 5, can cover 50% of the total illumination field 5 or an even smaller fraction, that is to say e.g. ⅓, ¼, ⅙, or else an even smaller fraction, e.g. ⅒, 1/20, or 1/50, of the total illumination field 5.

The illumination optical unit 40 can be embodied, with regard to the arrangement of the two facet mirrors 19, 20, in the manner of a specular reflector which, apart from the polarizing effect of the individual mirrors 26 and the facets 35, is known from US 2006/0132747 A1.

In the case of the embodiment according to FIG. 5, the illumination field section 5, has, in the y-direction, approximately one quarter of the y-extent of the total illumination field 5.

During projection exposure with the aid of the projection exposure apparatus 1, at least one part of the reticle 7 in the object field 5 is imaged onto a region of the light-sensitive layer onto the wafer 13 in the image field 11 for the lithographic production of a micro- or nanostructured component, in particular of a semiconductor component, for example of a microchip. In this case, the reticle 7 and the wafer 13 are moved in a temporally synchronized manner in the y-direction continuously in scanner operation.

The invention claimed is:

1. An illumination optical unit configured to illuminate an illumination field with illumination light, the illumination optical unit comprising:
   a first facet mirror comprising a plurality of individual mirrors, each individual mirror comprising a multilayer reflective coating;
   a second facet mirror comprising a plurality of individual facets,
   wherein:
      the second facet mirror is downstream of the first facet mirror along a path of the illumination light to the illumination field;
      each individual mirror of the first facet mirror is configured to guide a respective illumination light partial beam to the illumination field via a respective facet of the second facet mirror; and
      each individual mirror of the first facet mirror is configured so that its respective illumination light partial beam is incident on the individual mirror with an angle of incidence so that a ratio of a reflectivity of the individual mirror for illumination light polarized in a plane of incidence of the illumination light on the individual mirror to a reflectivity of the individual mirror for illumination light polarized perpendicular to the plane of incidence of the illumination light on the individual mirror is less than 0.7.

2. The illumination optical unit of claim 1, wherein each facet of the second mirror is configured to guide more than one illumination partial beam.

3. The illumination optical unit of claim 1, wherein, for each individual mirror, the angle of incidence is within 20° of a Brewster angle of the multilayer reflective coating of the individual mirror.

4. The illumination optical unit of claim 3, further comprising a first carrier, wherein each individual mirror is rotationally symmetrically arranged on the first carrier with respect to an axis of incidence of the illumination light incident on the first facet mirror.

5. The illumination optical unit of claim 4, further comprising a second carrier, wherein each facet of the second facet mirror is rotationally symmetrically arranged on the second carrier with respect to an axis of incidence of the illumination light incident on the first facet mirror.

6. The illumination optical unit of claim 5, wherein the second carrier is ring-shaped.

7. The illumination optical unit of claim 5, wherein the illumination optical unit is configured so that a section of the illumination field that is less than 80% of the total illumination field is illuminated via an illumination channel via which the illumination light is guided via a facet of the second facet mirror.

8. The illumination optical unit of claim 3, wherein the illumination optical unit is configured so that a section of the illumination field that is less than 80% of the total illumination field is illuminated via an illumination channel via which the illumination light is guided via a facet of the second facet mirror.

9. The illumination optical unit of claim 1, further comprising a first carrier, wherein each individual mirror is rotationally symmetrically arranged on the first carrier with respect to an axis of incidence of the illumination light incident on the first facet mirror.

10. The illumination optical unit of claim 9, further comprising a second carrier, wherein each facet of the second facet mirror is rotationally symmetrically arranged on the second carrier with respect to an axis of incidence of the illumination light incident on the first facet mirror.

11. The illumination optical unit of claim 10, wherein the second carrier is ring-shaped.

12. The illumination optical unit of claim 10, wherein the illumination optical unit is configured so that a section of the illumination field that is less than 80% of the total illumination field is illuminated via an illumination channel via which the illumination light is guided via a facet of the second facet mirror.

13. The illumination optical unit of claim 1, further comprising a carrier, wherein each facet of the second facet mirror is rotationally symmetrically arranged on the carrier with respect to an axis of incidence of the illumination light incident on the first facet mirror.

14. The illumination optical unit of claim 13, wherein the carrier is ring-shaped.

15. The illumination optical unit of claim 13, wherein the illumination optical unit is configured so that a section of the illumination field that is less than 80% of the total illumination field is illuminated via an illumination channel via which the illumination light is guided via a facet of the second facet mirror.

16. The illumination optical unit of claim 1, wherein the illumination optical unit is configured so that a section of the illumination field that is less than 80% of the total illumination field is illuminated via an illumination channel via which the illumination light is guided via a facet of the second facet mirror.

17. The illumination optical unit of claim 16, wherein, for each individual mirror, the angle of incidence is within 20° of a Brewster angle of the multilayer reflective coating of the individual mirror.

18. An illumination system, comprising:
   an illumination optical unit according to claim 1; and
   a projection optical unit configured to image an object field arranged in the illumination field into an image field.

19. An apparatus, comprising:
   an EUV light source configured to generate illumination light;
   an illumination optical unit according to claim 1; and
   a projection optical unit configured to image an object field arranged in the illumination field into an image field.

20. A method of operating a projection exposure apparatus comprising an illumination optical unit and a projection optical unit, the method comprising:
- using the illumination optical unit to illuminate at least some structures of a reticle; and
- using the projection optical unit to image at least some of the illuminated structure onto a light-sensitive material,
- wherein the projection optical unit comprises a projection optical unit according to claim 1.

* * * * *

UNITED STATES PATENT AND TRADEMARK OFFICE
CERTIFICATE OF CORRECTION

PATENT NO. : 9,195,057 B2
APPLICATION NO. : 14/465002
DATED : November 24, 2015
INVENTOR(S) : Ingo Saenger It is certified that error appears in the above-identified patent and that said Letters Patent is hereby corrected as shown below:

In the specification,

Col. 5, line 7, delete "16," and insert -- $16_i$ --.

Col. 6, line 10, delete "16," and insert -- $16_i$ --.

Col. 6, line 13, delete "16," and insert -- $16_i$ --.

Col. 6, line 16, delete "16," and insert -- $16_i$ --.

Col. 6, line 20, delete "16," and insert -- $16_i$ --.

Col. 6, line 38, delete "16" and insert -- $16_i$, --.

Col. 6, line 47, delete "$0.6R_0$" and insert -- $0.6\ R_0$ --.

Col. 7, line 7, delete "16," and insert -- $16_i$ --.

Col. 7, line 26, delete "16," and insert -- $16_i$ --.

Col. 7, line 31, delete "16," and insert -- $16_i$ --.

Col. 7, line 37, delete "16," and insert -- $16_i$ --.

Col. 7, line 39, delete "16," and insert -- $16_i$ --.

Col. 7, line 48, delete "16," and insert -- $16_i$ --.

Col. 7, line 51, delete "16," and insert -- $16_i$ --.

Col. 8, line 59, delete "5," and insert -- $5_i$ --.

Col. 8, line 63, delete "5," and insert -- $5_i$ --.

Col. 9, line 7, delete "5," and insert -- $5_i$ --.

Signed and Sealed this
Twenty-sixth Day of July, 2016

Michelle K. Lee
*Director of the United States Patent and Trademark Office*